United States Patent
Priestley et al.

(10) Patent No.: US 6,475,682 B2
(45) Date of Patent: Nov. 5, 2002

(54) PHOTOLITHOGRAPHY METHOD, PHOTOLITHOGRAPHY MASK BLANKS, AND METHOD OF MAKING

(75) Inventors: Richard S. Priestley, Corning, NY (US); Daniel R. Sempolinski, Painted Post, NY (US); Chunzhe C. Yu, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 10/067,490

(22) Filed: Feb. 4, 2002

(65) Prior Publication Data

US 2002/0090518 A1 Jul. 11, 2002

Related U.S. Application Data

(62) Division of application No. 09/458,254, filed on Dec. 9, 1999, now Pat. No. 6,410,192.
(60) Provisional application No. 60/165,625, filed on Nov. 15, 1999.

(51) Int. Cl.⁷ .............................. G03F 9/00; G02B 5/30
(52) U.S. Cl. ........................................ 430/5; 359/352
(58) Field of Search .............................. 430/5; 359/355, 359/350, 352; 385/730; 65/32.5; 428/426, 428

(56) References Cited

U.S. PATENT DOCUMENTS

| | | | |
|---|---|---|---|
| 5,043,002 A | 8/1991 | Dobbins et al. | 65/3.12 |
| 5,395,413 A | 3/1995 | Sempolinski et al. | 65/414 |
| 5,410,428 A | 4/1995 | Yamagata et al. | 359/350 |
| 5,415,953 A | 5/1995 | Alpay et al. | 403/5 |

(List continued on next page.)

FOREIGN PATENT DOCUMENTS

| | | | |
|---|---|---|---|
| EP | 0 735 006 | 10/1996 | C03B/19/14 |
| EP | 0 901 989 | 3/1999 | C03B/19/14 |
| EP | 0 968 969 | 1/2000 | C03B/19/14 |
| WO | 97/30933 | 8/1997 | C01B/33/12 |
| WO | 00/17115 | 3/2000 | C03B/8/04 |
| WO | 00/48046 | 8/2000 | C03F/9/00 |

OTHER PUBLICATIONS

HPFS® ArF GRADE, Corning Incorporated, May 1999, www.hpfs.corning.com.
HPFS® KrF GRADE, Corning Incorporated, May 1999, www.hpfs.corning.com.
HPSF® STANDARD GRADE, Corning Incorporated, May 1999, www.hpfs.corning.com.
Corning HPFS® Fused Silica Code 7980, Corning Incorporated, Oct. 1, 1999, www.hpfs.corning.com.
Corning Unveils New Product for Use in Making High-–Speed Computer Chips, Company News, Corning, New York, Nov. 1, 1999.
Corning New Product Information HPFS® Photomask Substrates Preliminary Data, Mar. 1999, hpfs@corning.com.
George H. Beall, Corning Incorporated, Sullivan Park FR–51, Corning, New York 14831, Industrial Applications of Silica, pp. 470–505.
Richard Priestly, USSN 09/458,561, filed Dec. 9, 1999, Automated System For Measurement Of An Optical Property, pp. 11.

*Primary Examiner*—S. Rosasco
(74) *Attorney, Agent, or Firm*—Edward F. Murphy

(57) ABSTRACT

The invention provides optical projection lithography methods, photolithography photomasks, and optical photolithography mask blanks for use in optical photolithography systems utilizing deep ultraviolet light (DUV) wavelengths below 300 nm, such as DUV projection lithography systems utilizing wavelengths in the 248 nm region and the 193 nm region. The invention provides improved production of lithography patterns by inhibiting polarization mode dispersion of lithography light utilizing low birefringence mask blanks and photomasks.

14 Claims, 14 Drawing Sheets

U.S. PATENT DOCUMENTS

| | | | |
|---|---|---|---|
| 5,599,371 A | 2/1997 | Cain et al. | 65/413 |
| 5,696,038 A | 12/1997 | Maxon | 501/54 |
| 5,698,484 A | 12/1997 | Maxon | 501/54 |
| 5,699,183 A | 12/1997 | Hiraiwa et al. | 359/355 |
| 5,896,222 A | 4/1999 | Rosplock et al. | 359/355 |
| 5,935,733 A | 8/1999 | Scott et al. | 430/5 |
| 5,951,730 A | 9/1999 | Schermerhorn | 65/17.3 |
| 6,069,749 A | 5/2000 | Omura | 359/727 |
| 6,087,283 A | 7/2000 | Jinbo et al. | 501/54 |

PHOTOLITHOGRAPHY METHOD, PHOTOLITHOGRAPHY MASK BLANKS, AND METHOD OF MAKING

This application which is a divisional of Ser. No. 09/458,254, filed Feb. 9, 1999, now U.S. Pat. No. 6,410,192, claims the benefit of U.S. Provisional Application Ser. No. 60/165,625, filed Nov. 15, 1999 entitled Photolithography Method, Photolithography Mask Blanks and Method Of Making of Richard S. Priestley, Daniel R. Sempolinski and C. Charles Yu.

BACKGROUND OF THE INVENTION

1. FIELD OF THE INVENTION

The present invention relates generally to optical projection lithography methods and photolithography photomasks, and particularly to optical photolithography mask blanks for use in optical photolithography systems utilizing deep ultraviolet light (DUV) wavelengths below 300 nm, such as DUV projection lithography systems utilizing wavelengths in the 248 nm region and the 193 nm region.

2. TECHNICAL BACKGROUND

Projection optical photolithography methods/systems that utilize the deep ultraviolet wavelengths of light below 300 nm provide benefits in terms of achieving smaller feature dimensions. Such methods/systems that utilize deep ultraviolet wavelengths in the 248 nm and the 193 nm wavelength regions have the potential of improving the manufacturing of integrated circuits with smaller feature sizes but the commercial use and adoption of deep UV in high volume mass production of integrated circuits has been slow. Part of the slow progression to DUV by the semiconductor industry has been due to the lack of economically manufacturable photomask blanks with high quality optical performance. For the benefit of deep ultraviolet photolithography in the 248 nm region such as the emission spectrum DUV window of a KrF excimer lasers and the 193 nm region such as the ArF excimer laser emission spectrum to be utilized in the manufacturing of integrated circuits there is a need for mask blanks that have beneficial optical properties and chemical durability that can be manufactured economically and utilized in photomasks.

Photomask blanks used in such lithography methods/systems are different from the other optical elements of the system such as lenses and mirrors in that the photomasks are generally very thin and play a unique part in the system in terms of providing a substrate for integrated circuit patterns that are projected through the system. Patterns of the integrated circuits to be made are formed on the photomask blanks, so that an image of the pattern on the photomask blank can be projected through the lithography system and printed on a surface of an integrated circuit semiconductor wafer. Photomask blanks must meet very strict requirements for dimensional stability to avoid warping and shrinking and for optical properties such as high transmission in order to ensure the extreme accuracy required to form very fine integrated circuit patterns and inhibit the distortion there of.

The present invention overcomes problems in the prior art and provides a means for economically manufacturing high quality improved photomask blanks and high performance masks that can be used to improve the manufacturing of integrated circuits with deep ultraviolet wavelengths.

SUMMARY OF THE INVENTION

Figure 1:
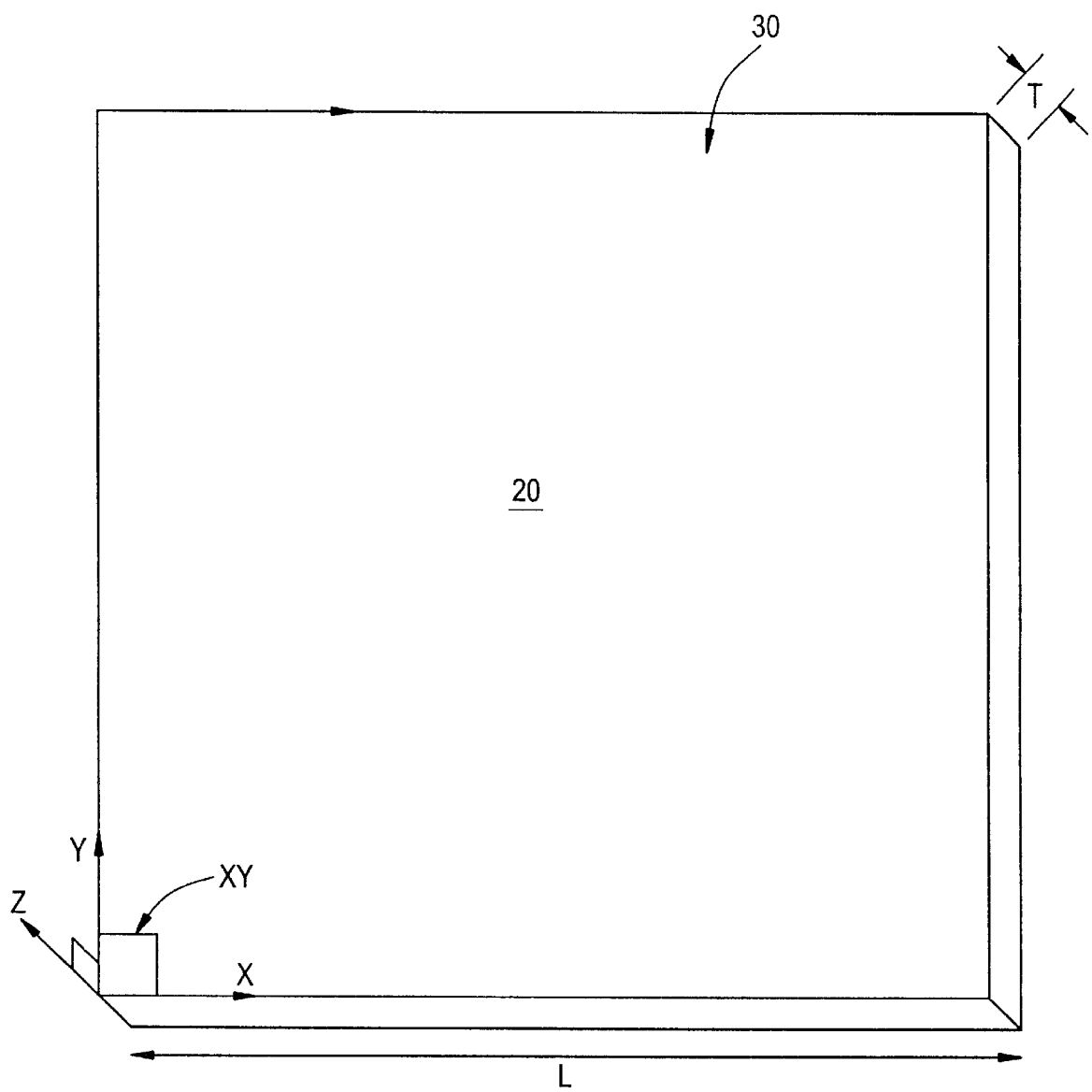
FIG. 1 is a perspective view of an embodiment of the invention.

One aspect of the present invention is a photolithography method and system for producing patterns having feature sizes $\leq 0.25$ microns. The photolithography method includes providing an illumination subsystem for producing and directing below 300 nm wavelength ultraviolet radiation $\lambda$ and providing a mask subsystem with a transmitting photolithography mask which includes a low birefringence fused silica $SiO_2$ glass wafer with photolithography pattern depictions with the $SiO_2$ glass wafer having a glass birefringence $\leq 2$ nm/cm. The method further includes providing a projection optics subsystem and a radiation sensitive print subsystem, aligning the subsystems and illuminating the mask with the ultraviolet radiation $\lambda$ such that the pattern depictions of the low birefringence glass wafer mask are projected onto the radiation sensitive print media wherein polarization mode dispersion of the ultraviolet radiation $\lambda$ is inhibited.

In another aspect, the present invention includes a below three hundred nanometer wavelength ultraviolet photolithography mask for producing patterns with feature sizes $\leq 0.25$ microns with the mask including a fused silica $SiO_2$ glass substrate wafer having a glass birefringence $\leq 2$ nm/cm. The glass wafer preferably has a chlorine concentration $\leq 1$ ppm Cl. The glass substrate wafer preferably has an internal transmission >99.5%/cm at 248 nm, an internal transmission >99%/cm at 193 nm, transmission variations at 248 nm and at 193 nm no greater than 1%, and a homogeneity $\Delta n \leq 50$ ppm.

In a further aspect, the present invention includes a method of making a lithography glass wafer photomask blank having a longest dimension length L. The method includes providing a fused silica $SiO_2$ glass preform disk having a preform disk diameter D and a preform disk height H with D>H, with diameter D lying in a plane defined by a preform disk x-axis and a preform disk y-axis, with the x-axis and the y-axis oriented normal to disk height H and disk height H in alignment with the preform disk z-axis. The method includes identifying a region in the preform disk that is preferably free of inclusion having a diameter greater than 1 $\mu$m. The method further includes maintaining the x-axis, y-axis, and z-axis orientation of the preform disk while removing the region from the preform disk to provide a photomask blank preform having a photomask blank preform x-axis, the photomask blank preform x-axis in alignment with the preform disk x-axis, a photomask blank preform y-axis which is in alignment with the preform disk y-axis, and a photomask blank preform z-axis which is in alignment with the preform disk z-axis. The method includes forming the photomask blank preform into a lithography photomask blank having a longest dimension length L.

The invention further includes a below three hundred nanometer wavelength ultraviolet lithography light polarization mode dispersion inhibiting photolithography mask blank for producing lithography patterns while inhibiting polarization mode dispersion of transmitted ultraviolet lithography light. The inventive polarization mode dispersion inhibiting mask blank comprises a fused silica $SiO_2$ glass wafer having a longest dimension L, a thickness T, a mask blank x-axis, a mask blank y-axis, and a mask blank z-axis. The length L lies in a plane defined by the mask blank x-axis and the mask blank y-axis, the thickness T normal to the plane defined by the mask blank x-axis and y-axis and parallel with the mask blank z-axis. The mask blank has a first refractive index $n_x$ along the mask blank x-axis and a second refractive index $n_y$ along the mask blank y-axis wherein $|n_x-n_y| \leq 1$ ppm. Preferably the mask blank has highly uniform DUV transmission across its face.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principals and operation of the invention.

DETAILED DESCRIPTION OF THE PREFERRED EMBODIMENTS

Figure 2:
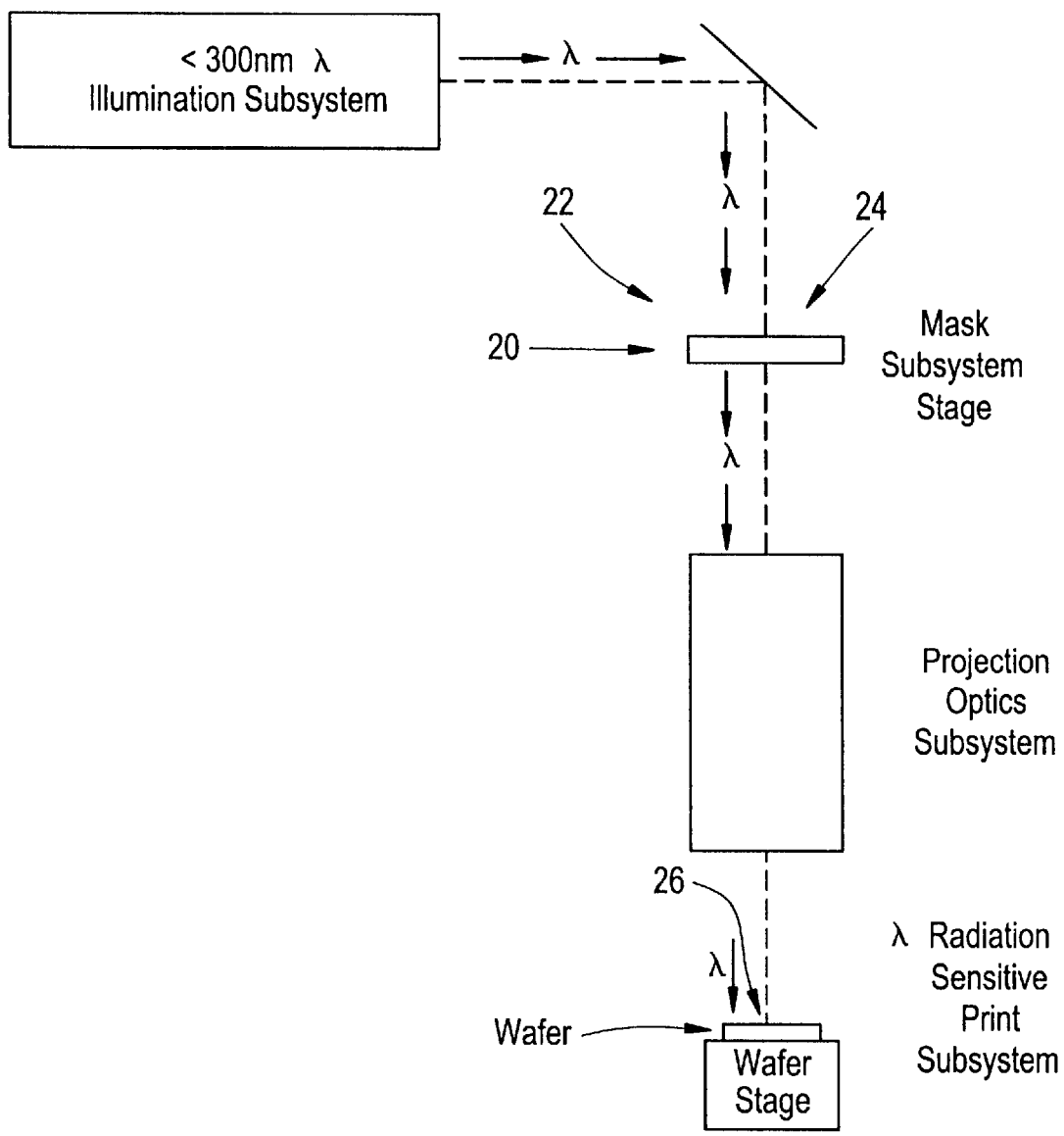
FIG. 2 is a side view of the invention and shows a method of the invention.

Reference will now be made in detail to the present preferred embodiments of the invention, examples of which are illustrated in the accompanying drawings. An exemplary embodiment of a glass wafer lithography photomask blank of the present invention is shown in FIG. 1–2 and is designated generally throughout by reference numeral 20.

Figure 3:
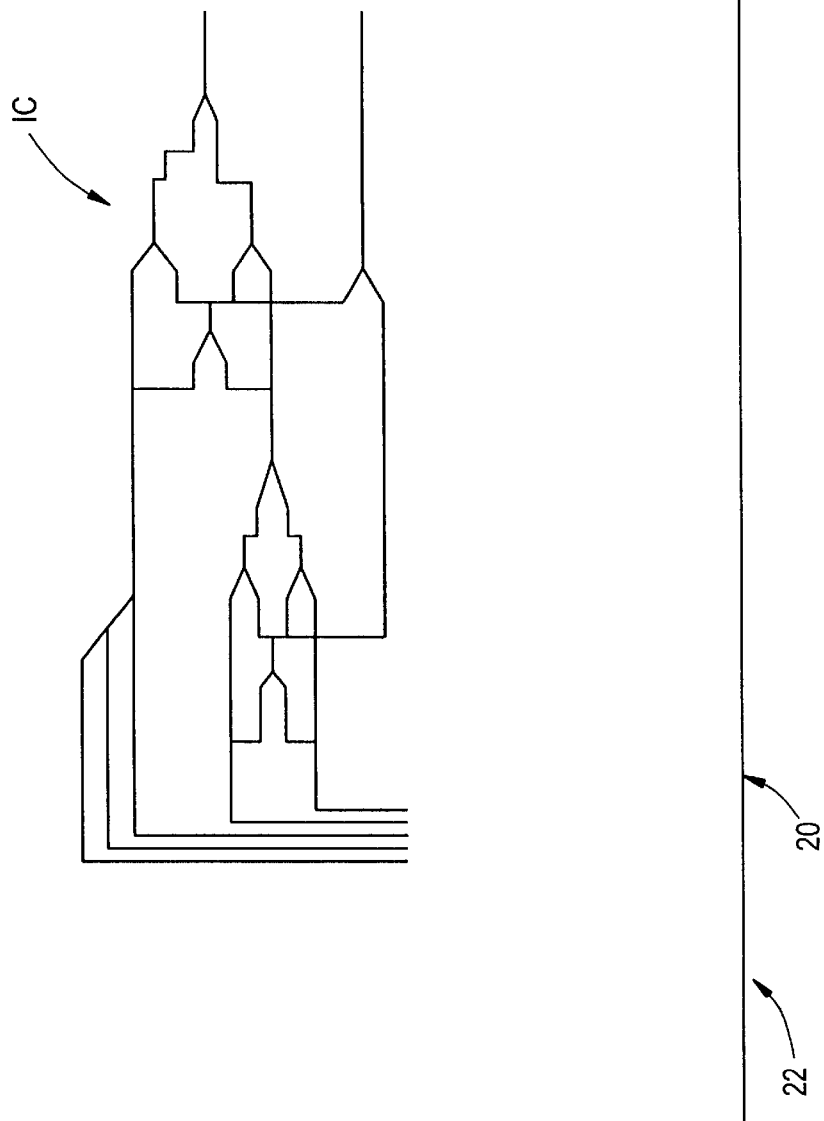
FIGS. 3≧5 illustrate integrated circuit (IC) lithography patterns in accordance with the invention.
Figure 4:
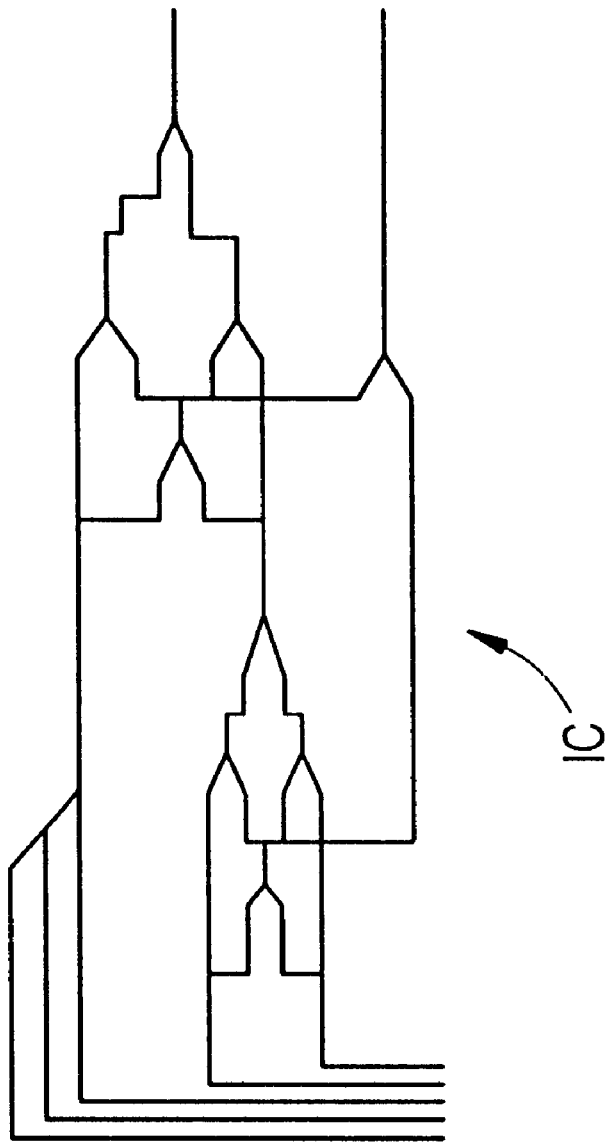
Figure 5:
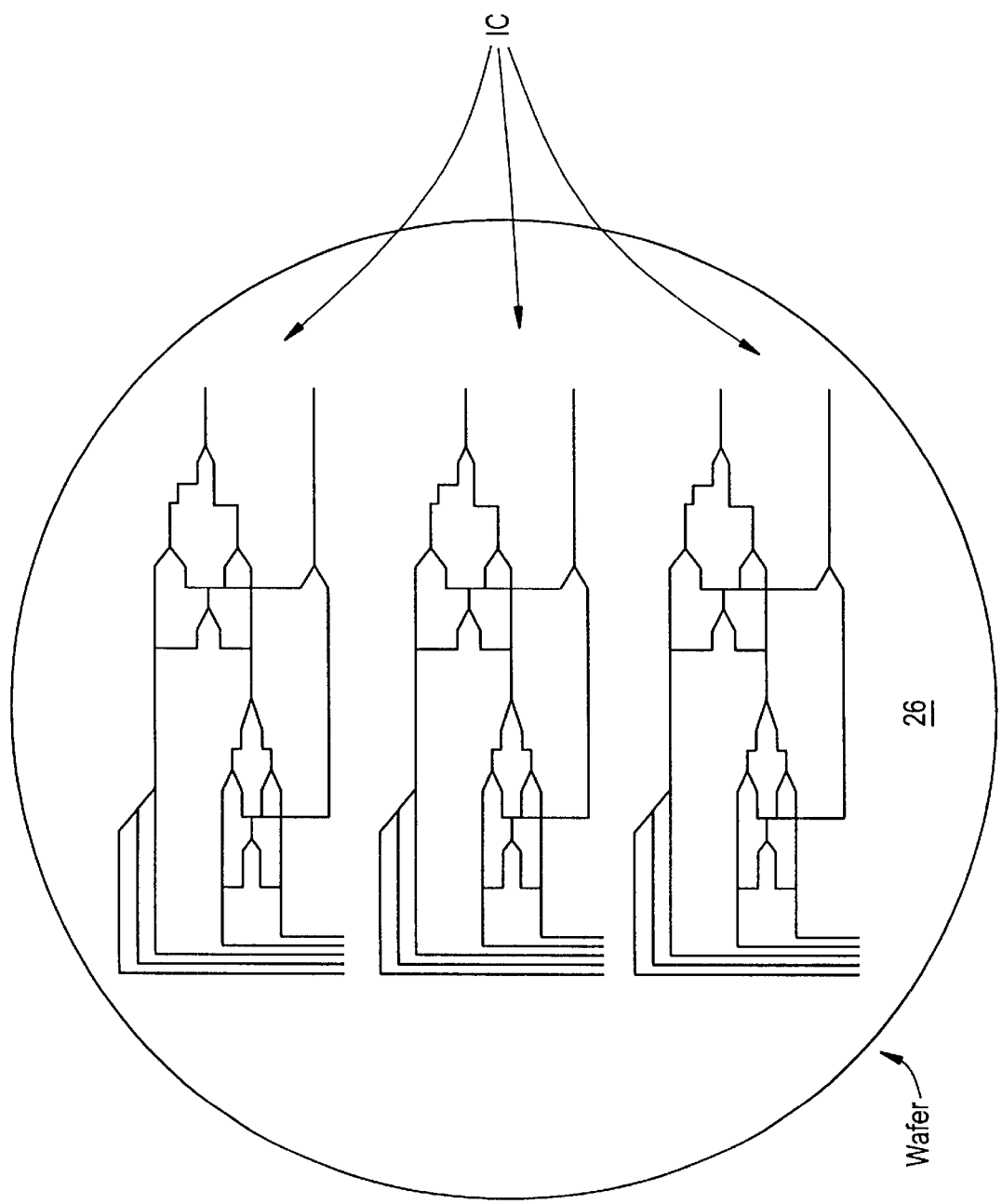
Figure 6:
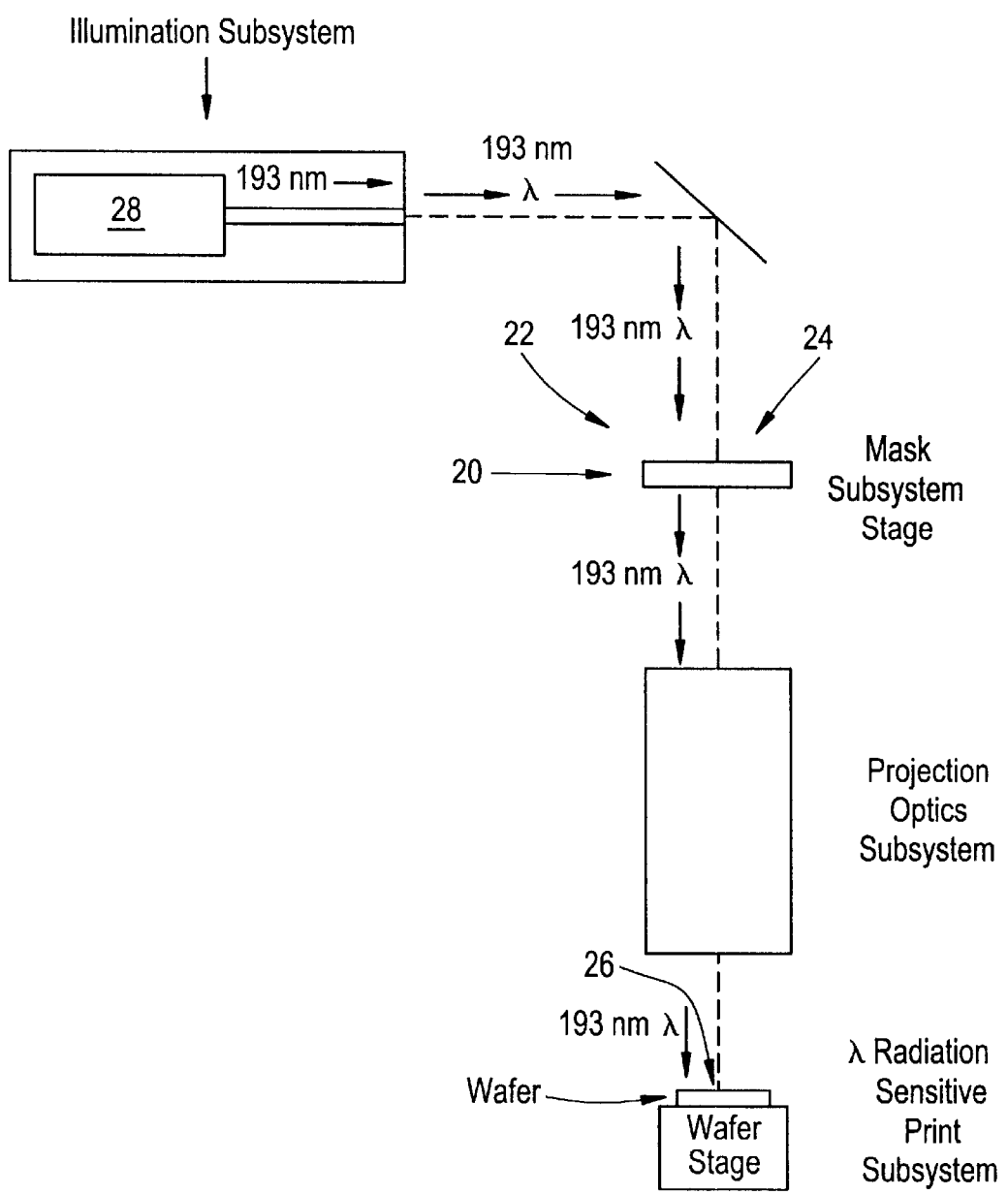
FIG. 6 is a side view of the invention and shows a method of the invention.
Figure 7:
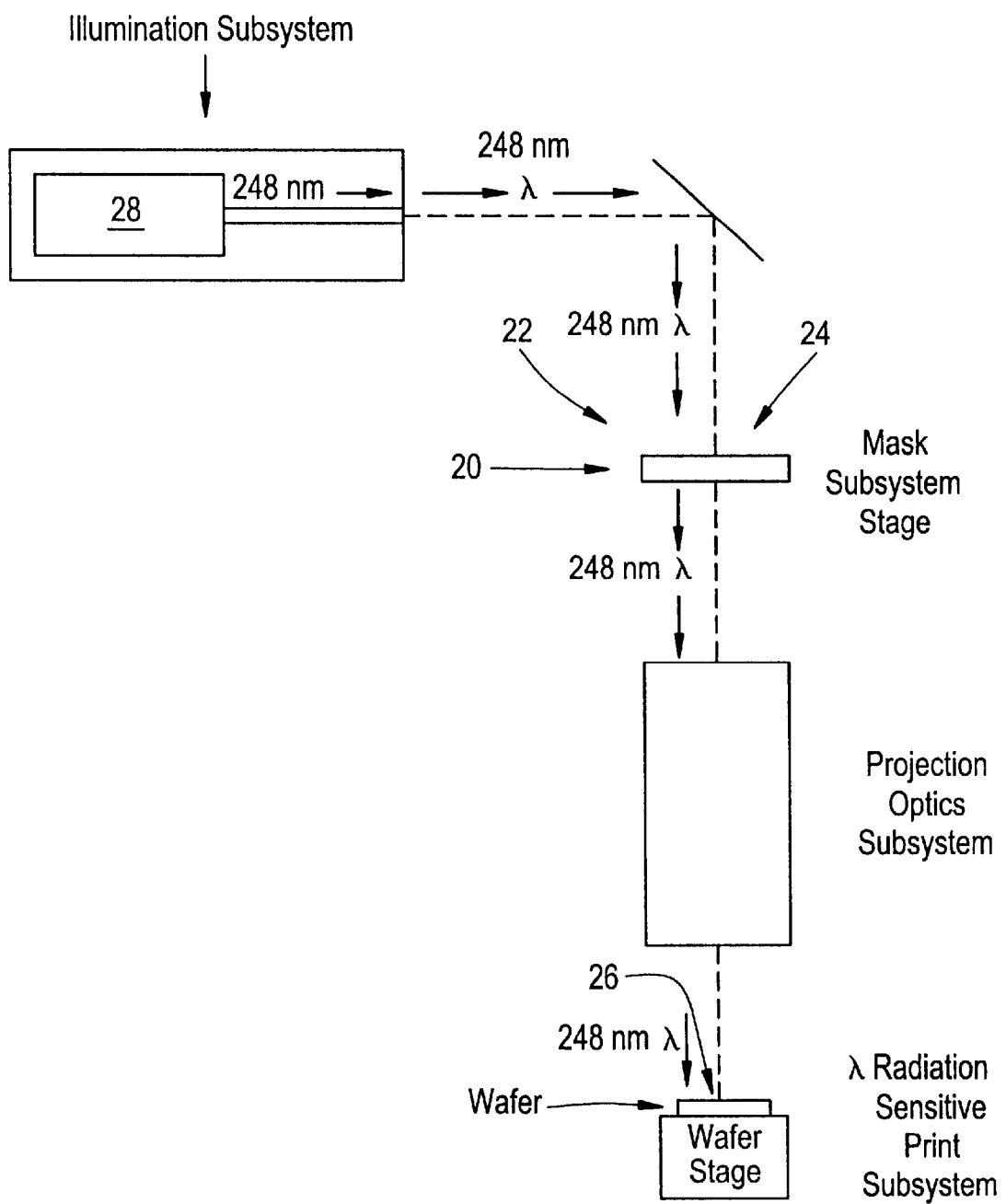
FIG. 7 is a side view of the invention and shows a method of the invention.

In accordance with the invention, the present invention for a photolithography method for producing lithography patterns includes the step of providing an illumination subsystem for producing and directing a <300 nm UV radiation $\lambda$. The method includes providing a mask subsystem with a mask stage and a transmitting photolithography mask 22 which includes a low birefringence fused silica $SiO_2$ glass wafer 20 with photolithography pattern depictions 24. Measured at 632.8 nm glass wafer 20 has a less than 5 nm/cm birefringence, preferably a glass birefringence $\leq 2$ nm/cm. Glass wafer 20 preferably has a glass birefringence $\leq 1$ nm/cm, and more preferably $\leq 0.5$ nm/cm. Preferably glass wafer 20 is a non-piece-annealed glass member which preferably has not been annealed in its glass wafer blank physical form. The method includes providing a projection optics subsystem and providing a $\lambda$ radiation sensitive print subsystem, which includes a radiation sensitive print media 26. As shown in FIG. 2, 6–7, the method further includes aligning the illumination subsystem, the mask subsystem, the projection optics subsystem, and the radiation sensitive print subsystem, and illuminating mask 22 with the radiation $\lambda$ with radiation $\lambda$ traveling through glass wafer 20 such that the photolithography pattern depictions IC of low birefringence $SiO_2$ glass wafer mask 22 are projected onto media 26. Utilizing low birefringence glass wafer 20 inhibits polarization mode dispersion of radiation $\lambda$ and preserves the integrity of the pattern shape information transmitted in the photolithography system and method. FIG. 3 shows mask 22 with photolithography pattern depictions IC on glass wafer 20. Photolithography IC patterns such as shown in FIG. 4 are formed from mask 22 with radiation $\lambda$ transmitted through glass wafer 20 with minimal polarization mode dispersion and distortion, transmitted through the projection optics and with the IC pattern projected onto integrated circuit wafer media 26 as shown in FIG. 5. The inventive photolithography method includes transmitting photolithography pattern depictions in the form of UV photons with $\leq 300$ nm wavelengths through the $SiO_2$ glass wherein polarization mode dispersion of the radiation $\lambda$ photolithography light is inhibited. In a preferred embodiment, the method includes providing an excimer laser 28 which produces UV radiation $\lambda$ and $\lambda$ includes a laser emission wavelength of 193 nm as shown in FIG. 6. In an alternative preferred embodiment, an excimer laser 28 which produces UV radiation $\lambda$ is provided and $\lambda$ includes a laser emission wavelength of 248 nm as shown in FIG. 7. In accordance with the invention the mask includes a low birefringence fused silica $SiO_2$ glass wafer which inhibits polarization based dispersion of radiation $\lambda$. The invention includes the method for forming lithography patterns by inhibiting polarization mode dispersion of lithography radiation $\lambda$.

In a preferred method, providing low birefringence fused silica $SiO_2$ glass wafer 20 includes providing a glass wafer 20 which consists essentially of silicon and oxygen. Providing low birefringence fused silica $SiO_2$ glass wafer 20 preferably includes providing an $SiO_2$ glass wafer that has a chlorine concentration that is less than 1 ppm Cl, and more preferably is chlorine free and consists essentially of Si and ).

In a preferred embodiment of the invention $SiO_2$ glass wafer 20 is a non-piece-annealed glass wafer in that the glass piece glass wafer 20 has not been annealed in its glass wafer physical form state. It is preferred that the low birefringence of glass wafer 20 is not achieved by annealing glass wafer 20. In a preferred embodiment the glass is annealed in a preform physical state that is distinct from and larger than the glass wafer glass piece, preferably with the glass being annealed as a fused silica $SiO_2$ glass preform disk, with the physical size of the glass preform that is annealed being considerably larger than that of glass wafer 20 (much larger volume and much larger longest dimension; at least twice, preferably at least thrice, more preferably at least quadruple). A preferred glass wafer 20 is provided when piece annealing is not used to achieve low birefringence.

In a preferred embodiment providing glass wafer 20 includes providing a $SiO_2$ glass wafer which has an optical homogeneity ($\Delta n$) $\leq 50$ ppm and a uniform $\lambda$ transmission across the wafer with transmission at $\lambda$ across the face of the wafer having a variation $\leq 1.5\%$. Preferably $\lambda$ transmission across face 30 of glass wafer 20 varies $\leq 1\%$.

In a preferred embodiment providing glass wafer 20 includes providing a $SiO_2$ glass wafer which has an internal transmission ≧99.5%/cm at 248 nm and an internal transmission ≧9%/cm at 193 nm. In a further preferred embodiment the method includes providing a SiO$_2$ glass wafer with 248 nm internal transmission ≧99.5%/cm and 193 nm internal transmission ≧99%/cm, a glass birefringence ≦1 nm/cm, a chlorine concentration <1 ppm Cl, a 248 nm transmission variation ≦1% and a 193 nm transmission variation ≦1%, and a homogeneity (Δn) ≦5 ppm. With the SiO$_2$ glass being chlorine free and having a homogenous Si and O composition improved transmission, transmission uniformity, and low birefringence, SiO$_2$ glass wafer 20 has beneficial optical properties in addition to beneficial glass chemistry which provides for improved manufacturing of mask 22 and its use in lithography. Such a glass wafer 20 is utilized to minimize detrimental polarization based dispersion problems while being economically manufacturable. In the preferred method providing the mask subsystem and illuminating photolithography mask 22 with ultraviolet radiation λ includes inhibiting the polarization mode dispersion of ultraviolet radiation λ through the glass wafer with the glass wafer having a glass birefringence measured at 632.8 nm that is less than 5 nm/cm. Preferably polarization dispersion is inhibited with a glass wafer birefringence ≦2 nm/cm, more preferably ≦1 nm/cm, and most preferably ≦0.5 nm/cm.

In a further aspect, the invention includes a below three hundred-nanometer wavelength ultraviolet photolithography mask for producing patterns with feature sizes ≦0.25 microns. The mask includes a fused silica SiO$_2$ glass substrate wafer having a glass birefringence ≦2 nm/cm as measured at 632.8 nm. The mask preferably has a chlorine concentration <1 ppm Cl. The mask preferably has an internal transmission ≧99.5%/cm at 248 nm and an internal transmission ≧99%/cm at 193 nm, a transmission variation ≦1% at 248 nm and 193 nm, and a homogeneity (Δn) that is ≦50 ppm.

In a preferred embodiment the mask fused silica SiO$_2$ glass substrate wafer 20 has a chemical durability weight loss ≦0.453 mg/cm$^2$ from submersed exposure to a 95° C. temperature 5% NaOH solution by weight in water for an exposure time length of about 6 hours. Preferably the fused silica SiO$_2$ glass substrate wafer has a chemical durability weight loss ≦0.015 mg/cm$^2$ from water exposure to 95° C. deionized H$_2$O wafer for 24 hours, ≦0.230 mg/cm$^2$ from exposure to 25° C. 10% HF solution by weight in water for 20 minutes,≦0.010 mg/cm from exposure to 95° C. 5% HCl solution by weight in water for 24 hours, and ≦0.46 mg/cm$^2$ from exposure to 95° C. 5% NaOH solution by weight in water for 6 hours. Such a fused silica SiO$_2$ glass substrate wafer 20 has a chemical resistivety that provides for beneficial and economic processing into a mask. Such beneficial chemical resistivety is preferably achieved by insuring that fused silica SiO$_2$ glass is halogen free and has less than 1 ppm Cl. Preferably fused silica SiO$_2$ glass substrate wafer 20 consists essentially of silicon and oxygen, and most preferably is halogen free. Halogen free fused silica SiO$_2$ glass substrate wafer 20 is preferably free of Cl and F, and has less than 1 ppm Cl. Preferably wafer 20 has less than 1 ppm F. Preferably the fused silica SiO$_2$ glass contains less than 1500 ppm OH by weight, and more preferably ≦1000 ppm OH. Preferably wafer 20 consisting essentially of Si and O has an OH content of 500 to 1000 ppm, and more preferably 800 to 1000 ppm OH. In addition to 500 to 1000 ppm OH, the fused silica SiO$_2$ glass preferably contains less than 1000 ppb of impurities other than OH. More preferably the fused silica SiO$_2$ glass contains from 800 to 1000 ppm OH and from 100 to 1000 ppb impurities other than OH. A preferred below 300 nm UV photomask has a fused silica SiO$_2$ glass substrate wafer with an OH concentration which varies less than 200 ppm, more preferably the variation in OH in the glass wafer is less than 100 ppm. Preferably the glass wafer is formed from a fused silica SiO$_2$ glass preform disk 32 with a variation in OH less than 200 ppm, most preferably ≦100 ppm. In a preferred embodiment fused silica SiO$_2$ glass substrate wafer 20 contains <0.5 ppm by weight Cl, and most preferably any trace contaminate Cl ions are substantially homogeneously distributed throughout the glass substrate wafer. In a preferred embodiment fused silica SiO$_2$ glass substrate wafer 20 contains <1 ppm by weight Na, preferably with any trace contaminate Na ions substantially homogeneously distributed throughout the glass substrate wafer. Preferably the glass has ≦0.5 ppm wt. S. In addition to the preferred fused silica SiO$_2$ glass consisting essentially of Si and O, it is preferred that fused silica SiO$_2$ glass contains less than 1500 ppm OH by weight, ≦0.05 ppm wt. Li, ≦0.35 ppm wt. B, ≦0.1 ppm wt. F, ≦3.3 ppm wt. Na, ≦0.2 ppm wt. Mg, ≦0.3 ppm wt. Al, ≦0.15 ppm wt. P, ≦0.5 ppm wt. S, ≦0.45 ppm wt. Cl, ≦2.5 ppm wt. K, ≦1.5 ppm wt. Ca, ≦0.15 ppm wt. Ti, ≦0.04 ppm wt. V, ≦0.5 ppm_wt. Cr, ≦0.02 ppm wt. Mn, ≦1.3 ppm wt. Fe, ≦0.02 ppm wt. Co, ≦0.06 ppm wt. Ni, ≦0.01 ppm wt. Cu, ≦0.5 ppm wt. Zn, ≦0.1 ppm wt. Ga, ≦0.5 ppm wt. Ge, ≦0.05 ppm wt. Zr, ≦0.15 ppm wt. Mo, ≦0.1 ppm wt. Sn, ≦0.1 ppm wt. Sb,≦0.1 ppm wt. Pb, ≦0.05 ppm wt. Bi. Such trace contaminate levels can be measured such as by glow discharge mass spectroscopy and sputtered neutrals mass spectroscopy where the glass forms a cathode of a low pressure discharge in argon and the positive ions are extracted through a small slit and accelerated into a high resolution mass spectrometer. A glow discharge mass spectroscopy—sputtered neutrals mass spectroscopy of a mask wafer 20 sample indicated that the fused silica SiO$_2$ glass sample had such low contaminate levels of ≦0.05 ppm wt. Li, ≦0.32 ppm wt. B, ≦0.1 ppm wt. F, ≦3.3 ppm wt. Na, ≦0.17 ppm wt. Mg, ≦0.27 ppm wt. Al, ≦0.13 ppm wt. P, ≦0.5 ppm wt. S, ≦0.45 ppm wt. Cl, ≦2.5 ppm wt. K, ≦1.5 ppm wt. Ca, ≦0.12 ppm wt. Ti, ≦0.0035 ppm wt. V, ≦0.5 ppm wt. Cr, ≦0.0015 ppm wt. Mn, ≦1.3 ppm wt. Fe, ≦0.011 ppm wt. Co, ≦0.059 ppm wt. Ni, ≦0.010 ppm wt. Cu, ≦0.5 ppm wt. Zn, ≦0.1 ppm wt. Ga, ≦0.5 ppm wt. Ge, ≦0.05 ppm wt. Zr, ≦0.15 ppm wt. Mo, ≦0.1 ppm wt. Sn, ≦0.1 ppm wt. Sb, ≦0.1 ppm wt. Pb, ≦0.05 ppm wt. Bi.

In a preferred embodiment fused silica SiO$_2$ glass substrate wafer 20 of the photolithography mask contains less than 3×10$^{17}$ molecules of H$_2$ per cm$^3$. More preferably fused silica SiO$_2$ wafer 20 contains from about 0.5×10$^{17}$ to about 3×10$^{17}$ molecules of H$_2$/cm$^3$, and most preferably from 1×10$^{17}$ to 2.5×10$^{17}$ molecules of H$_2$/cm$^3$.

In a preferred embodiment photolithography mask fused silica SiO$_2$ glass substrate wafer 20 has a fictive temperature of about 1050° C. +50° C., and more preferably a fictive temperature in the range from 1050 to 1060° C.

In a preferred embodiment of the mask wafer 20 has high measured external transmission at both 248 nm and 193 nm through the thickness T of the wafer. In a preferred embodiment fused silica SiO$_2$ glass substrate wafer 20 has a measured external transmission at 248 nm of at least 92% preferably for a wafer thickness T of at least 6.35 mm and more preferably for a wafer thickness of at least 9 mm. In a preferred embodiment fused silica SiO$_2$ glass substrate wafer 20 has a measured external transmission at 193 nm of at least 90% preferably for a wafer thickness T of at least 6.35 mm and more preferably for a wafer thickness of at least 9 mm. In a preferred embodiment a wafer 20 with a thickness of 6.35 mm the measured external transmission at 193 nm is at least 90.3%. In a further embodiment a wafer 20 with a thickness of 9 mm the measured external transmission at 193 nm is at least 90%. In a preferred embodiment fused silica $SiO_2$ glass substrate wafer 20 has an absolute refractive index of about 1.50860 at 248 nm and about 1.56084 at 193 nm. Preferably fused silica $SiO_2$ glass substrate wafer 20 is free of inclusions which have a dimension greater than about one micron. Being free of inclusions >1 μm provides mask 22 with preferred optical performance. In a preferred embodiment glass substrate wafer 20 has a glass birefringence $\leq 1$ nm/cm, more preferably $\leq 0.5$ nm/cm. Such low birefringence glass substrate wafers inhibit the polarization mode dispersion of lithography radiation λ that travels through the glass.

Figure 8:
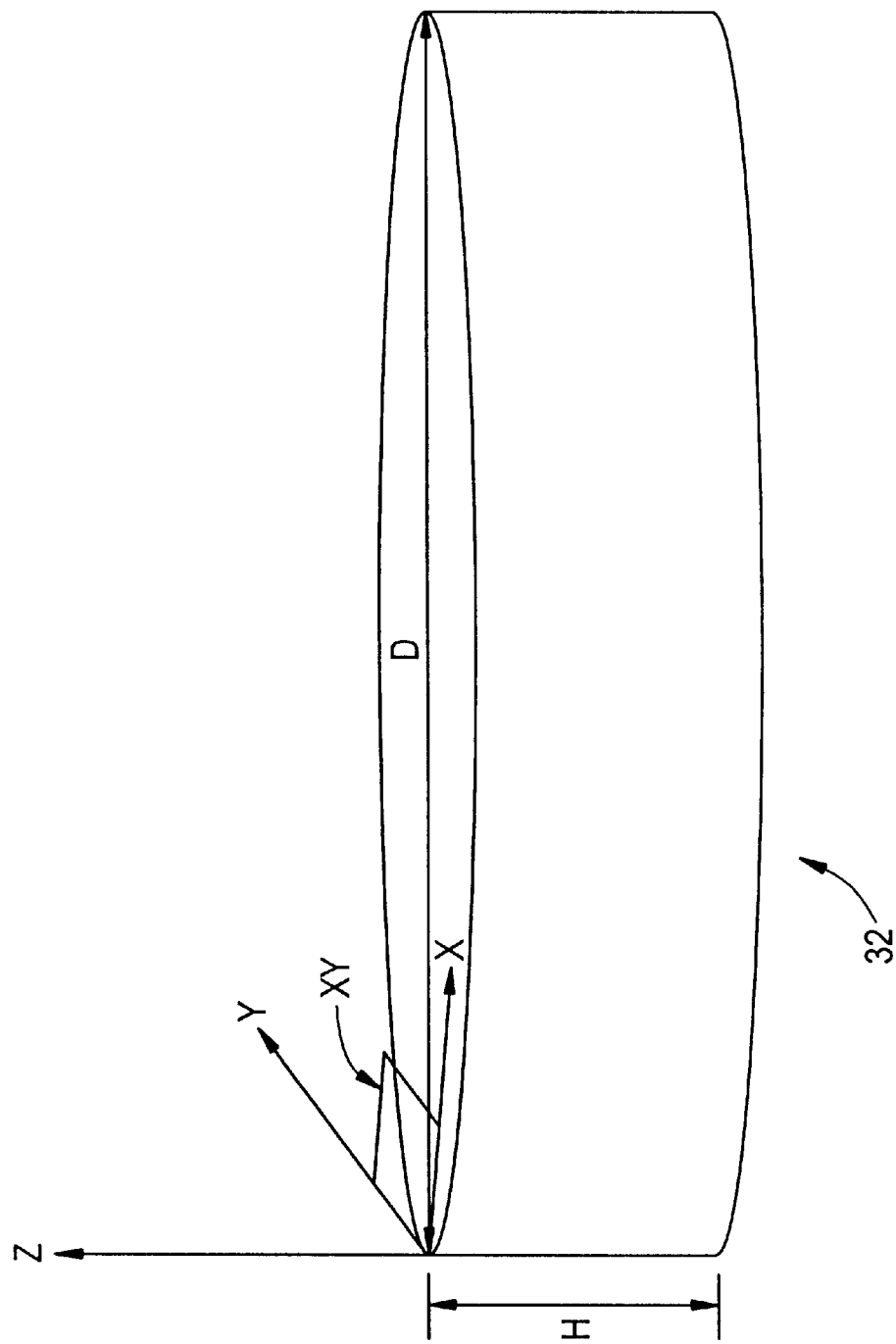
FIG. 8 is a perspective view of an embodiment of the invention.
Figure 9A:
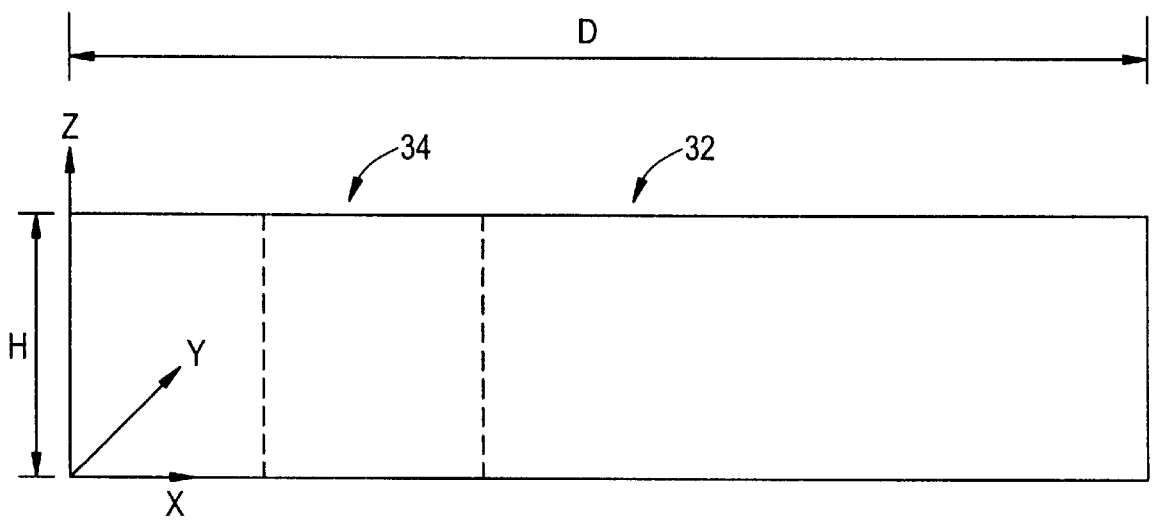
FIGS. 9 a–c is a side view of the invention and shows a method of the invention.
Figure 9B:
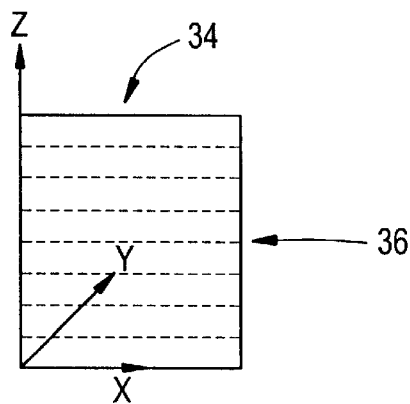
Figure 9C:
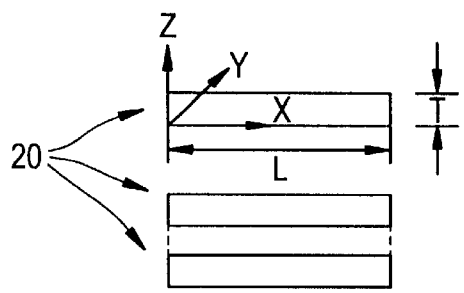

The invention includes a method of making a lithography photomask blank having a longest dimension length L that includes providing a fused silica $SiO_2$ glass preform disk having a preform disk diameter D and a preform disk height H with D>H. As shown in FIG. 8, fused silica $SiO_2$ glass preform disk 32 has a height H and a diameter D, with diameter D lying in plane xy defined by preform disk x-axis and preform disk y-axis, and the x-axis and the y-axis oriented normal to preform disk height H. Disk height H is in alignment with the preform disk z-axis. As shown in side view process flow FIG. 9 a–c, the method includes identifying an inclusion free region 34 in preform disk 32 with preform disk inclusion free region 34 including glass free of inclusions having diameters greater than 1 μm. As shown in FIG. 9a and 9b the method includes maintaining the preform disk x-axis, y-axis, and z-axis orientation while removing inclusion free region 34 from preform disk 32 to provide a photomask blank preform 36 having a photomask blank preform x-axis in alignment with the preform disk x-axis, a photomask blank preform y-axis in alignment with the preform disk y-axis, and a photomask blank preform disk z-axis. As shown in FIG. 9b, 9c and 1, the method includes forming photomask blank preform 36 into a lithography photomask blank 20 having a longest dimension length L. In a preferred method of the invention, lithography photomask blank 20 has a thickness T, a lithography photomask blank x-axis, a lithography photomask blank y-axis, and a lithography photomask blank z-axis with the lithography photomask blank x-axis and the lithography photomask blank y-axis in alignment with the photomask blank preform x-axis and the photomask blank preform y-axis. The longest dimension length L of lithography photomask blank 20 lies in plane xy defined by photomask blank x-axis and y-axis and the lithography photomask blank thickness T is aligned with the lithography photomask blank z-axis and normal to the photomask blank x-axis and y-axis and the thickness T is less than L. Preferably T is much smaller than L, more preferably 10T <L.

With the inventive method the fused silica $SiO_2$ glass preform 32 has a flat geometry, preferably a flat disk shape versus a tall columnary shape where the height, in the z axis orientation, is larger than the base dimension in the xy plane. Such a preform with a flat geometry shape versus a tall geometry shape provide a preferred photomask blank with uniform optical characteristics including low birefringence that provide improved lithography performance. In a preferred embodiment providing fused silica $SiO_2$ glass preform disk 32 includes providing preform disk 32 with a longest dimension diameter D that is greater than or equal to twice the height H (D$\geq$2H), more preferably with D$\geq$3H, and most preferably D$\geq$4H.

Figure 10:
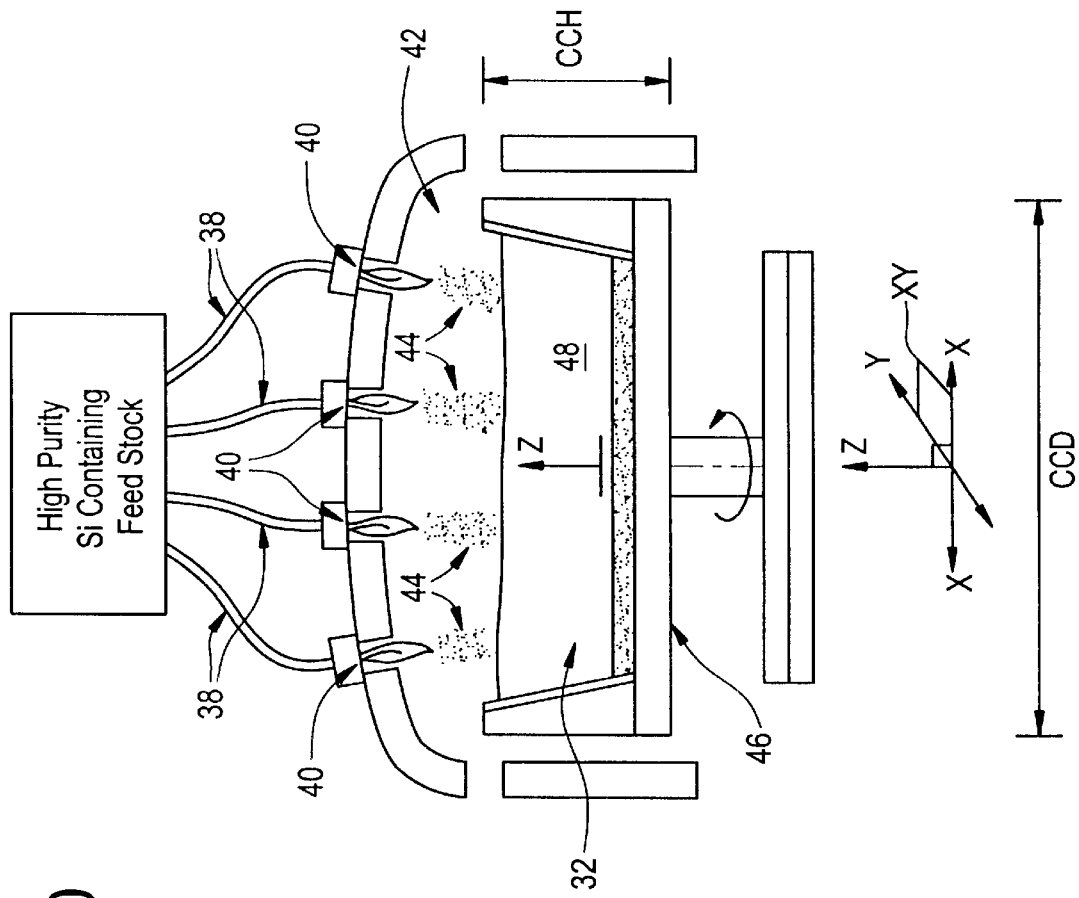
FIG. 10 is a side view of the invention and shows a method of the invention.
Figure 11:
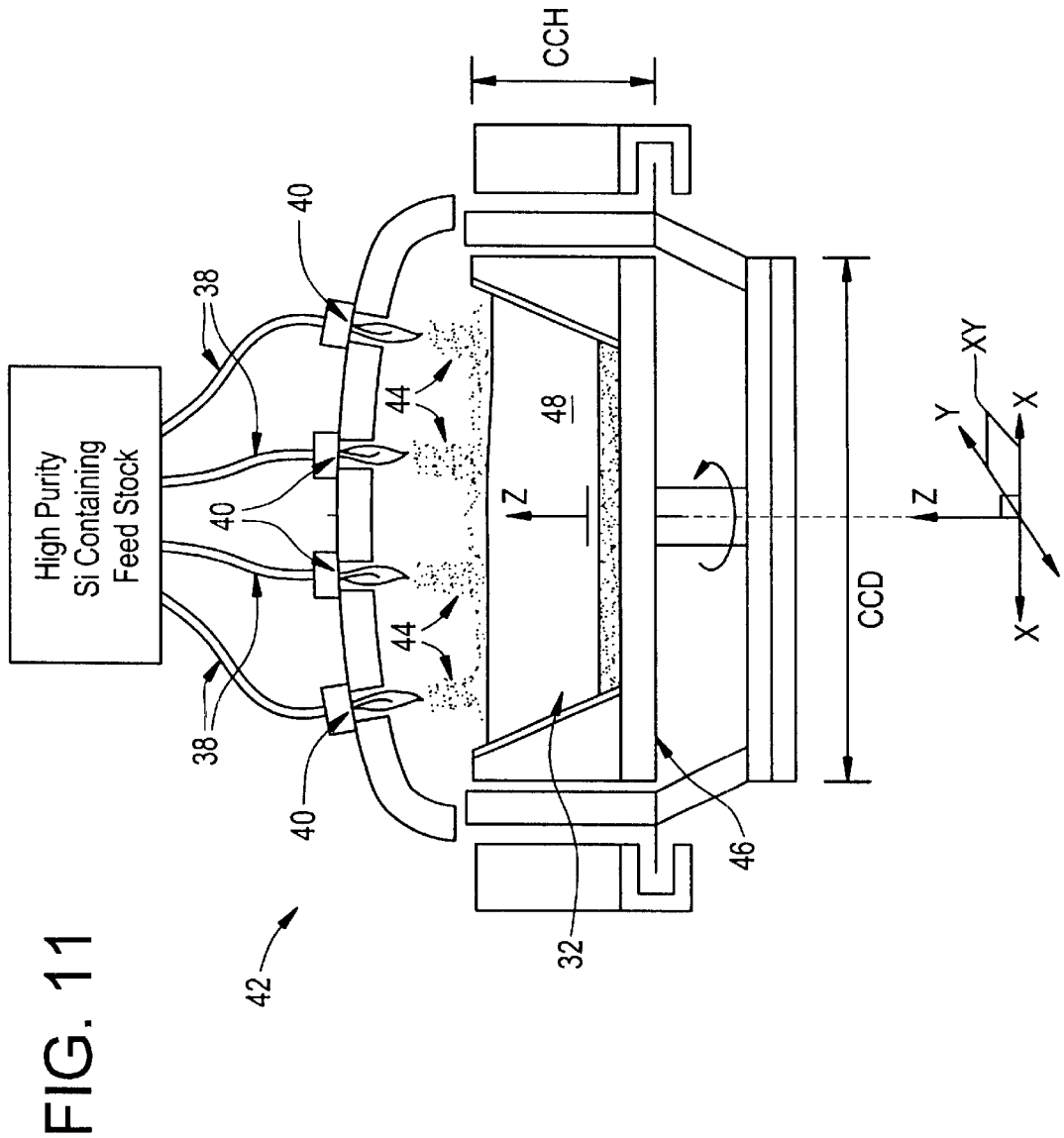
FIG. 11 is a side view of the invention and shows a method of the invention.

In a preferred embodiment of the method, providing fused silica $SiO_2$ glass preform disk 32 includes providing a high purity Si containing feedstock, delivering the high purity Si containing feedstock to a conversion site, converting the delivered feedstock into $SiO_2$ soot, depositing the $SiO_2$ soot on a revolving refractory horizontally oriented collection cup, concurrently with the soot deposition consolidating the $SiO_2$ soot into a high purity fused $SiO_2$ glass body, supporting the high purity fused $SiO_2$ glass body with the collection cup, and annealing the glass body to provide the fused silica $SiO_2$ glass preform disk 32. FIG. 10 and FIG. 11 show methods of making and providing fused silica $SiO_2$ glass preform disk 32. In a preferred embodiment the high purity Si containing feedstock is delivered in vapor form through delivery conduits 38 to conversion site burner conversion flames 40 at conversion site furnace 42 which converts the Si containing feedstock into $SiO_2$ soot 44 which is deposited on revolving horizontally oriented collection cup 46 and consolidated into high purity fused $SiO_2$ glass body 48. Preferably conversion site furnace 42 is constructed of fired refractory bodies made from zircon and have below 30 ppm sodium contamination contents. Furnace 42 including cup 46 is preferably comprised of sintered porous zircon that is free of contaminants and preferably which are obtained by removing the contaminants prior to forming glass, such as by calcining with a halogen containing cleaning/contaminant removing atmosphere. Preferred low contaminant zircon refractories are disclosed in U.S. Pat. No. , 5,395,413, Mar. 7, 1995, by Daniel Sempolinski and Latha Swaroop, and in PCT Application WO 97/30933, Aug. 28, 1997, Pure Fused Silica Furnace by Pavlik et al., which are incorporated by reference. Rotating cup 46 is oriented horizontally (parallel to xy plane, normal to z axis), preferably in addition to rotation cup 46, cup 46 is moved in the xy plane using an x-y oscillation table with xy oscillation movement patterns. As shown in FIG. 11 it is preferred to minimize and inhibit changes in gas flow and the environment within furnace 42 so that a consistent glass body 48 is produced. A preferred furnace is disclosed in U.S. Pat. No. 5,951,730, Sep. 14, 1999, by Paul Schermerhorn, which is incorporated by reference. The temperature within furnace 42 is maintained at a high temperature to ensure consolidation of soot 44 into glass body 48 as it is deposited, preferably the operating temperature of furnace 42 and glass body 48 is at least 1500° C., more preferably at least 1600° C., and most preferably at least 1650° C.

Along with such high temperatures which allow the glass body to flow in a preferred embodiment cup 46 is constructed with sloping side walls as shown in FIG. 11 which are not as steep as those in FIG. 10 and promote beneficial movement and flow of the glass. Preferred collection cup containment vessels are disclosed in U.S. Pat. No. 5,698,484, Dec. 16, 1997 by John Maxon, which is incorporated by reference. Preferably horizontally oriented collection cup 46 has a collection cup height CCH and a collection cup diameter CCD, with CCH >H and CCD >D. Providing fused silica $SiO_2$ glass preform disk 32 includes discarding the periphery of glass body 48, particularly the periphery of glass body 48 in contact with cup 16, so that photomask blanks originate from the non-outer periphery parts of glass body 48. As shown in FIGS. 10–11, glass body 48 is preferably contained within collection cup 46. In addition to containing the physical form of the flowable glass, collection cup 46 protects the glass body from changes and influences of the surrounding environment and most preferably inhibits heat loss from the glass body in that cup 46 is formed from a refractory insulating material, and particularly reduces heat loss from the sides and bottom of glass body 48 with heat being generated above glass body 48 by the flames of burners 40, and from auxiliary heat sources such as heat source burners that are also located in furnace conversion site 42 above glass body 48 and cup 46. In a preferred embodiment, the invention includes continuously depositing soot 44 in cup 46 while concurrently consolidating the $SiO_2$ soot in order to build up a fused $SiO_2$ glass body while maintaining the temperature of the building up body at a temperature of at least 1500° C. Built up glass body 48 is preferably maintained at such temperature needed for consolidation (consolidation temperature) with the temperature of the entire glass body being substantially homogeneous and even throughout. Preferably such temperatures are maintained by minimizing heat loss from the glass body 48 throughout its production. The flat disk geometrie such as with fused $SiO_2$ glass preform disk having D ≧2H, preferably helps to minimize heat loss from the surfaces of glass body 48. The formation of such flat disk shaped bodies, preferably within an insulating containing cup, minimize heat loss through the side of the body opposite the heat source (bottom of body 48 is opposite of heat sources on top of furnace 42) and from the sides of body 48. Such flat disk shapes beneficially inhibit heat loss through the bottom and sides compared to geometry's based on long tall columns. As shown in FIGS. 10–11, it is preferred that $SiO_2$ soot 44 travels down into cup 46 along a downward deposition path from the conversion flames of burners 40, and revolving cup 46 is rotated in a plane of rotation substantially perpendicular to the downward deposition path of soot 44. The plane of rotation of cup 46 is parallel with the plane defined by the preform disk x-axis and the preform disk y-axis. In addition to revolving motion in the rotation plane parallel to the xy plane, cup 46 is translated in an oscillation motion in such a xy parallel plane preferably utilizing oscillation rotation patterns as disclosed in U.S. Pat. No. 5,696,038, Dec. 9, 1997, Boule Oscillation Patterns In Methods of Producing Fused Silica Glass by John Maxon, which is incorporated by reference.

In a preferred embodiment fused silica $SiO_2$ glass preform disk 32 is annealed inside a furnace 42 after the formation of glass body 48 is completed and production and deposition of soot 44 is ended. In a preferred method of making lithography photomask blank 20, the glass is not annealed after removal from preform disk 32 in that photomask blank preform 36 and individual blanks 20 are not annealed. In the preferred embodiment any birefringence present in the glass is reduced in the large physical size of preform disk 32 and body 48 and not during processing after the preform disk, such that resulting photomask blanks are low birefringence photomask blanks with glass birefringence less than 2 nm/cm. Preferably the low birefringence of the photomask blank is achieved by annealing the glass in the preform disk 32 state or before and is not annealed thereafter. In an alternative embodiment photomask blank preform 36 is annealed after removal from disk 32, and lithography photomask blank 20 is not annealed but has a glass birefringence ≦2 nm/cm. Preferably the method avoids physically distorting, working and kneading the glass at soften glass temperatures.

In a preferred embodiment of the method the $SiO_2$ producing feedstock is halide-free and providing fused silica $SiO_2$ glass preform 32 preferably includes providing a high purity halide-free Si containing siloxane feedstock, delivering the siloxane feedstock to conversion site 42, converting the delivered siloxane into $SiO_2$ soot 44, depositing the $SiO_2$ soot and concurrently consolidating the $SiO_2$ soot into a fused $SiO_2$ glass body. Siloxane feedstocks such as polymethyl siloxanes, preferably cyclic polymethyl siloxanes, most preferably octamethylcyclotetrasiloxane, decamethylcyclopentasiloxane, and hexamethylcyclotrisiloxane ($D_3$, $D_4$, $D_5$) are preferred as high purity Si containing feedstock for their high content of Si atoms, heat producing capability, relatively low production of diluting gaseous by products which lower soot deposition efficiency, and that they are halide and chlorine free. Preferred burners, for use with converting such halide-free siloxane feedstocks are disclosed in Corning Incorporated's PCT International Patent Application No. #(Attorney Docket Reference #CGW-247PCT), *Burners For Producing Boules of Fused Silica Glass,* by Laura Ball et al., filed on Sep. 17, 1999, which is incorporated by reference. Octamethylcyclotetrasiloxane is the most preferred siloxane feedstock.

In the making of lithography photomask blanks having a largest dimension length L, it is preferred that providing a fused silica $SiO_2$ glass preform disk 32 includes providing a preform disk 32 having diameter D such that D is more than twice the longest dimension length L. Preferably D ≧3L, more preferably D ≧4L, and most preferably D ≧5L. By forming photomask blanks from much larger glass preform bodies the photomask blanks have beneficial optical and lithography characteristics including low birefringence. In a preferred practice, disk diameter D and the lithography photomask blank length L are related by 12 L ≧D≧4L, more preferably 10 L≧D >5L, and the photomask blank length L is oriented parallel to the preform disk diameter D and the photomask blank thickness T is oriented parallel to the preform disk height H. FIG. 9a–9c show such alignment of the disk height H and the photomask blank thickness T.

Forming photomask blank preform 36 into lithography photomask blanks 20 preferably includes cutting a plurality of photomask blanks from preform 36 and polishing the cut photomask blanks. The invention further includes forming a lithographic pattern on photomask blank 20 and transmitting below three hundred nanometer wavelength radiation through said photomask blank.

Figure 12A:
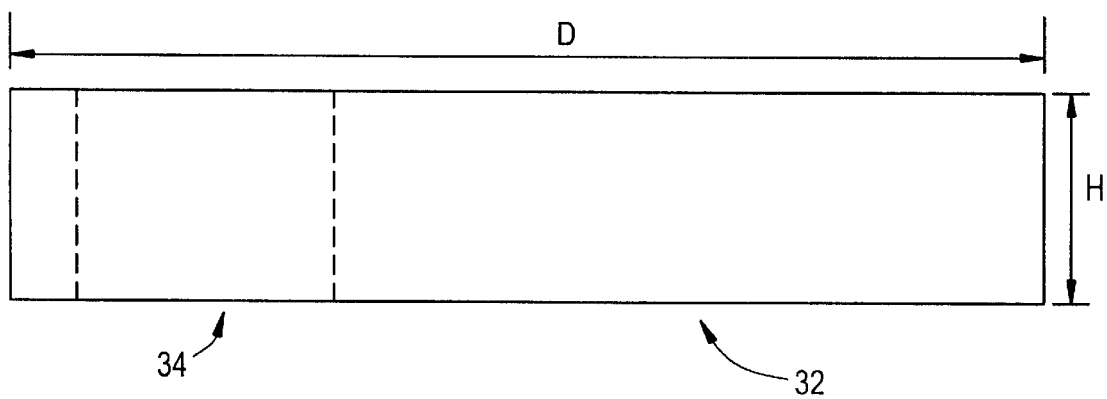
FIGS. 12 a–c is a side view of the invention and shows a method of the invention.
Figure 12B:
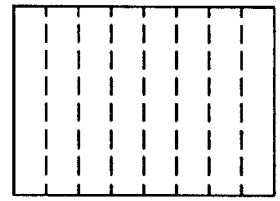
Figure 12C:
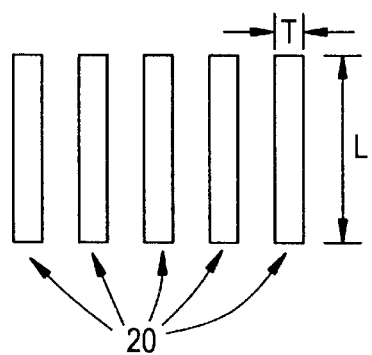

An alternative method of making preform 32 into photomask blanks 20 is shown in FIG. 12a–12c. As shown in FIG. 12a–12c, photomask blanks 20 have a thickness T normal to the length L, and thickness T is normal to the preform 32 disk height H.

The invention includes a below three hundred nonaometer wavelength ultraviolet lithography light polarization mode dispersion inhibiting photolithography mask blank for producing lithography patterns while inhibiting polarization mode dispersion of transmitted ultraviolet lithography light. The polarization mode dispersion inhibiting mask blank is comprised of a fused silica $SiO_2$ glass wafer 20 having a longest dimension length L, a thickness T, a mask blank x-axis, a mask blank y-axis, a mask blank z-axis. The length L lies in a plane defined by the mask blank x-axis and the mask blank y-axis, with the thickness T normal to the x-axis, y-axis (xy) plane. The thickness T is parallel with the mask blank z-axis. Mask blank 20 has a first refractive index $n_x$ in the x-axis direction along said mask blank x-axis and a second refractive index $n_y$ in the y-axis direction along said mask blank y-axis wherein the absolute value of $n_x$ minus $n_y$ is less than or equal to 1 ppm. Preferably 193 nm and 248 nm transmission through the mask is uniform across the face (xy plane) of mask blank 20.

In a preferred embodiment mask blank 20 has a uniform transmission through the mask with a maximum 193 nm transmission $trans_{193xmax}$ and a minimum 193 transmission $trans_{193xmin}$ in the x-axis direction along the mask blank x-axis with ($trans_{193xmax}$–$trans_{193xmin}$)≦1%. Additionally transmission through the mask is uniform with a maximum 193 nm transmission $trans_{193ymax}$ and a minimum 193 nm transmission $trans_{193ymin}$ in the y-axis direction along the mask blank y-axis with $(trans_{193ymax}-trans_{193ymin}) \leq 1\%$ Beneficial uniform transmission of 193 nm lithography light through the thickness of mask blank 20 viewed across the xy plane face of the mask is achieved with such minimal differences of maximum and minimum transmission across the xy face with transmission variation $\leq 1\%$. In addition to such uniform transmission of 193 nm wavelength light, mask blank 20 preferably has uniform 248 nm wavelength transmission through the mask thickness across its face. Mask blank 20 has a maximum 248 nm transmission $trans_{248xmax}$ and a minimum 248 nm transmission $trans_{248}$ along the mask blank x-axis, a maximum 248 nm transmission $trans_{248ymax}$ and a minimum 248 nm transmission $trans_{248ymin}$ along the mask blank y-axis with $(trans_{248xmax}-trans_{248xmin}) \leq 1\%$ and $(trans_{248ymax}-trans_{248ymin}) \leq 1\%$. Also the difference between the maxs and between the mins is small with $|trans_{248xmax}-trans_{248ymax}| \leq 1\%$ and $|trans_{248xmin}-trans_{248ymin}| \leq 1\%$. Such uniform 248 run and 193 nm transmission through the mask thickness T in the z-axis direction as viewed across the xy plane face of the mask blank provide improved optical performance in the use of the photolithography method/system. Such uniform transmission as viewed and mapped out across the xy plane insures that IC pattern is uniformly transmitted to the projection optics and results in improved 193 nm/248 nm wavelength exposure of the IC pattern on the radiation sensitive wafer. The preferred method of making mask blanks 20 from considerably larger preforms 32 unexpectantly results in mask blanks with such optical performance uniformity including uniform 193 nm and 248 nm transmission and low birefringence with minimal differences in refractive index. Additionally a benefit is achieved not only in uniformity within a mask blank itself, but also uniformity in performance from mask blank piece to mask blank piece is achieved.

Preferably polarization mode dispersion inhibiting photolithography mask blank 20 is free of inclusions having a dimension greater than one micron. Preferably the fused silica $SiO_2$ glass wafer mask blank 20 consists essentially of Si and O. Preferably the fused silica $SiO_2$ glass contains less than 1 ppm Cl, has an OH content less than 1500 ppm OH, and a hydrogen content less than $3 \times 10^{17}$ molecules of $H_2/cm^3$. Preferably the OH concentration of the glass varies less than 100 ppm, and if any trace levels of Cl are in the glass the Cl concentration varies less than 0.5 ppm Cl, with the glass most preferably having less than 0.5 ppm Cl. Preferably the glass has a low sulfur contamination level with S concentration $\leq 0.5$ ppm. Such low contamination levels of the fused silica $SiO_2$ glass ensure beneficial optical performance of the mask blank and provide beneficial chemical and physical properties. Preferably mask blank 20 has a chemical durability weight loss $\leq 0.453$ mg/cm$^2$ from submersed exposure to a 95° C. temperature 5% NaOH solution by weight in water for a length of 6 hours.

The invention includes high performance fused silica below 300 nm lithography mask blanks that have a combination of a wide array of property specifications including beneficial optical, chemical, and physical properties. The beneficial combination of the properties of mask blanks 20 and the fused silica $SiO_2$ glass material of the blanks is preferably dictated by the production methods used to manufacture the blanks. The redistilled high purity octamethylcyclotetrasiloxane feedstock, conversion site furnace 42, rotation and oscillation of cup 46 and glass body 48, and the relatively large shape and size of preform disk 32 provide a mask blank 20 with a beneficial combination of properties including 193 nm and 248 nm transmission, resistance to induced absorption and birefringence, optical uniformity low birefringence, low attenuation, and good chemical and processing durability. Mask blank 20 has a preferable low birefringence range in combination with preferred ranges of optical, chemical, and physical characteristics, preferably with good 193 nm and 248 nm transmission and radiation damage resistance. Birefringence is a measure of the refractive index difference between two orthogonal or perpendicular axes. A linearly polarized beam of light propagating in the 'z' direction through a transparent birefringent medium will propagate with a velocity '$v_x$' if its electric field is polarized in the 'x' direction. If the beam is sent along the same optical path with its electric field now polarized in the 'y' direction, it will propagate with a velocity of 'v'. The velocity difference between the two directions is a result of a refractive index difference between the two directions. Polarized along the 'x' axis causes the beam to see a refractive index of '$n_x$' while along the 'y' axis the beam sees a refractive index of '$n_y$'. Birefringence is the difference between '$n_x$' and '$n_y$', or '$n_x-n_y$'. In optical elements such as photomasks, birefringence can change the polarization of the beam from its optimal state and subsequently degrade the system performance, such as causing localized illumination non-uniformity. For designs such as lithography stepper systems which utilize a linearly polarized beam and containing a polarization sensitive optical elements, this adverse effect is especially damaging. Using a system (with 632.8 nm light) capable of measuring birefringence down to 0.25 nm/cm a variety of photomask blank substrates were analyzed. Such analysis can be performed using a system such as disclosed in Attorney Docket No. Priestley-1, co-filed U.S. patent application entitled Automated System For Measurement Of An Optical Property by Richard Priestley, which is incorporated by reference. The analysis showed that commercially available photomask blank substrates typically have birefringence values ranging between 5–20 nm/cm, and the present inventive mask blanks 20 have preferable birefringence values below 5 nm/cm, and most preferably below 2 nm/cm. The preferred mask blank 20 has less than 1 ppm Cl, with the chlorine free fused silica $SiO_2$ glass providing radiation damage resistance in addition to beneficial chemical durability, low birefringence, and uniform transmission. The improved chemical durability of the chlorine free fused silica $SiO_2$ glass is an advantage for mask blanks 20 in terms of resistance to subsurface damage during polishing, particularly chemical/mechanical finishing, improved surface finish capability, and rate of material etching.

The preferred mask blank 20 has 193 nm and 248 nm DUV transmissions uniformity that varies $\leq 1.5\%$, more preferably $\leq 1\%$, and has a homogeneity ($\Delta n$) $\leq 50$ ppm, preferably $\leq 5$ ppm, most preferably $\leq 1$ ppm. The inventive method of making mask blank 20 preferably achieves such high transmission uniformity and high homogeneity utilizing relatively large preforms 32, particularly compared to the relatively small size of mask blank 20.

Figure 13:
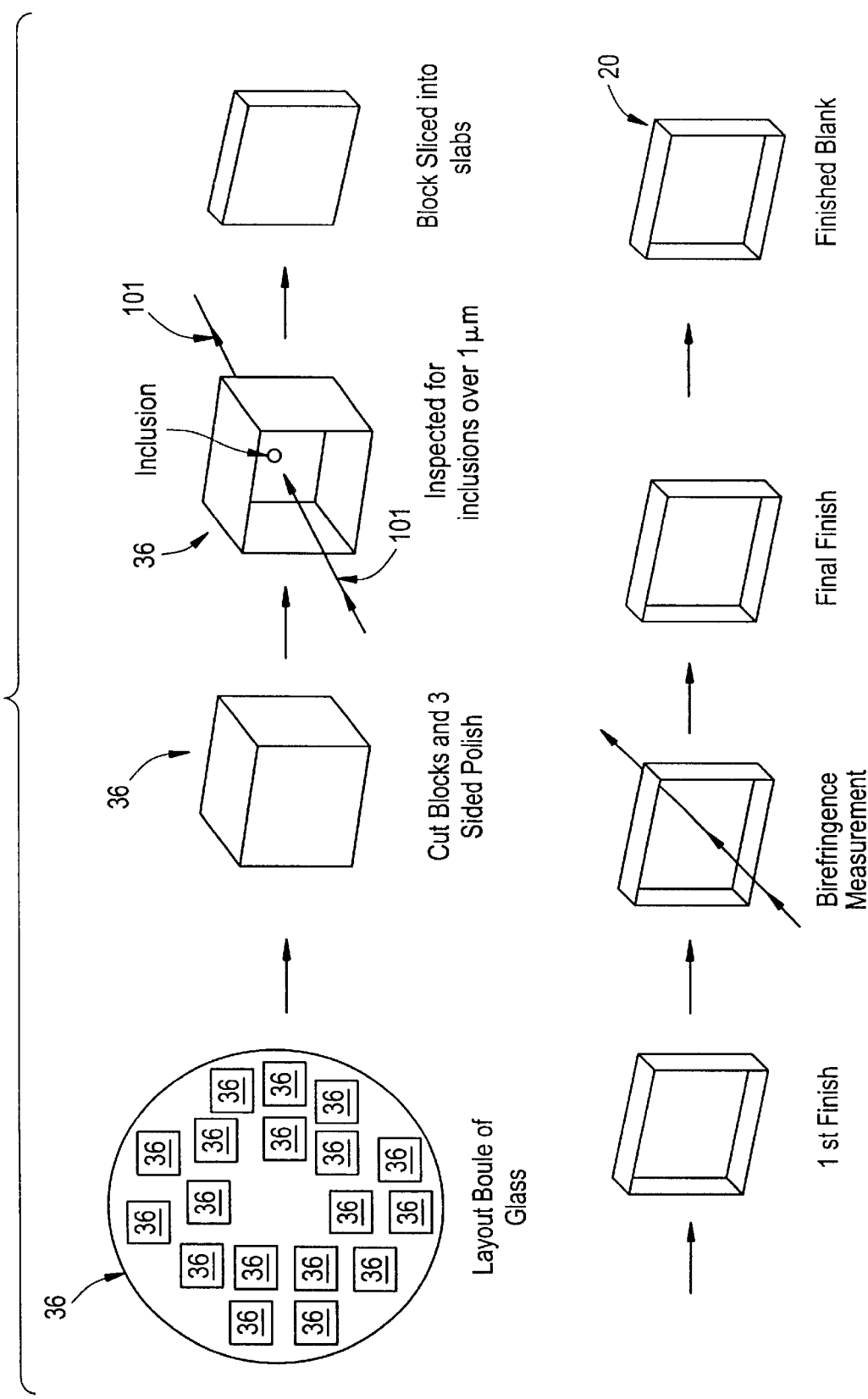
FIG. 13 shows a method of the invention.

In a preferred practice of the invention preform disk 32 has a diameter greater than 20 inches (50 cm) such as D about 3 to 5 feet (0.91 to 1.5 meters) and a height H of about 6 to 10 inches (15 to 25 cm) with the mask blanks 20 made therefrom having a longest dimension L<12 inches (30 cm) such as blank dimensions of about 10 inches ×10 inches (25 cm×25 cm), about 9 inches×9 inches (22.8 cm×22.8 cm) and about 6 inches×6 inches (15 cm×15 cm), with thickness T of about ¼ inch (0.63 cm). Numerous mask blanks 20 can be cut from the larger preform disk 32, with the large preform disk size providing improved transmission uniformity and homogeneity, particularly compared to commercially available photomask substrates formed from small preform columns that have near net preform dimensions close to the dimensions of the photomask substrates. FIG. 13 illustrates a process flow of a preferred method of making mask blanks 20. Preform disk 32 is provided such as shown in FIG. 10–11, with a conversion flame lay down process and employing oscillation/rotation of cup 46. The location of photomask blank preforms 36 is layed out on preform disk 32, preferably with the center of disk 32 avoided. As shown in FIG. 13 the location layout of photomask blank preforms 35 is preferably staggered to avoid any human eye visually detectable inclusions. A non-staggered checker board aligned column-row formations can be used without inspecting for detectable inclusions in preform disk 32 with inclusion containing glass discarded later in the process. After the location layout of photomask blank preforms 36 are determined the photomask blank preform blocks 36 are cut out of preform disk 32. A representative photomask blank preform block 36 has a square base of about 6½ inch×6½ inch (16.5 cm×16.5 cm) and a height of about 5–6 inches (12 cm to 15 cm). The cut out blocks 36 are polished on three sides to allow inspection and mapping of the glass interior. The interior is inspected using the three polished sides by transmitting light through the two opposing polished sides in order to identify, mark and map any inclusions over 1 μm in size which may be in the interior volume of the glass. An optical measurement system is preferably used to scan an inspection laser light beam (HeNe scan beam) 101 through the volume of block 36 to identify inclusions, with the inclusion observed through the third polished side, so that the location of the inclusion can be mapped and marked for subsequent removal. A method and system such as disclosed in co-filed U.S. patent application entitled Automated System For Measurement Of An Optical Property, Attorney Docket No. Priestley-1, by Richard Priestley, which is incorporated by reference, can be used. Block 36 is then sliced into blank slabs, with the slabs sliced so that identified inclusions are removed. Inclusions are cut around with the cut blank slabs having a thickness of about 0.4–0.5 inches (1–1.3 cm). The cut blank slabs are then pre-finished with chemical-mechanical finishing, flatness lap, flat plate flatness polishing and edge polishing to provide a pre-finished mask blank that can be measured for birefringence, such as with a scanning light beam optical measurement system. The pre-finished mask blank is measured for birefringence. In an alternative embodiment the birefringence of the glass can be measured in the block form as done for inclusion inspection.. A method and system such as disclosed in co-filed U.S. patent application entitled Automated System For Measurement Of An Optical Property, Attorney Docket No. Priestley-1, by Richard Priestley, which is incorporated herein, can be used for birefringence measurements. The pre-finished mask blank is then given a final finish to provide finished mask blank 20. The final finish preferably includes chemical mechanical polishing to a super polish below 5 angstroms finish and flatness, cleaned and packaged for incorporation into a mask 22.

Figure 14:
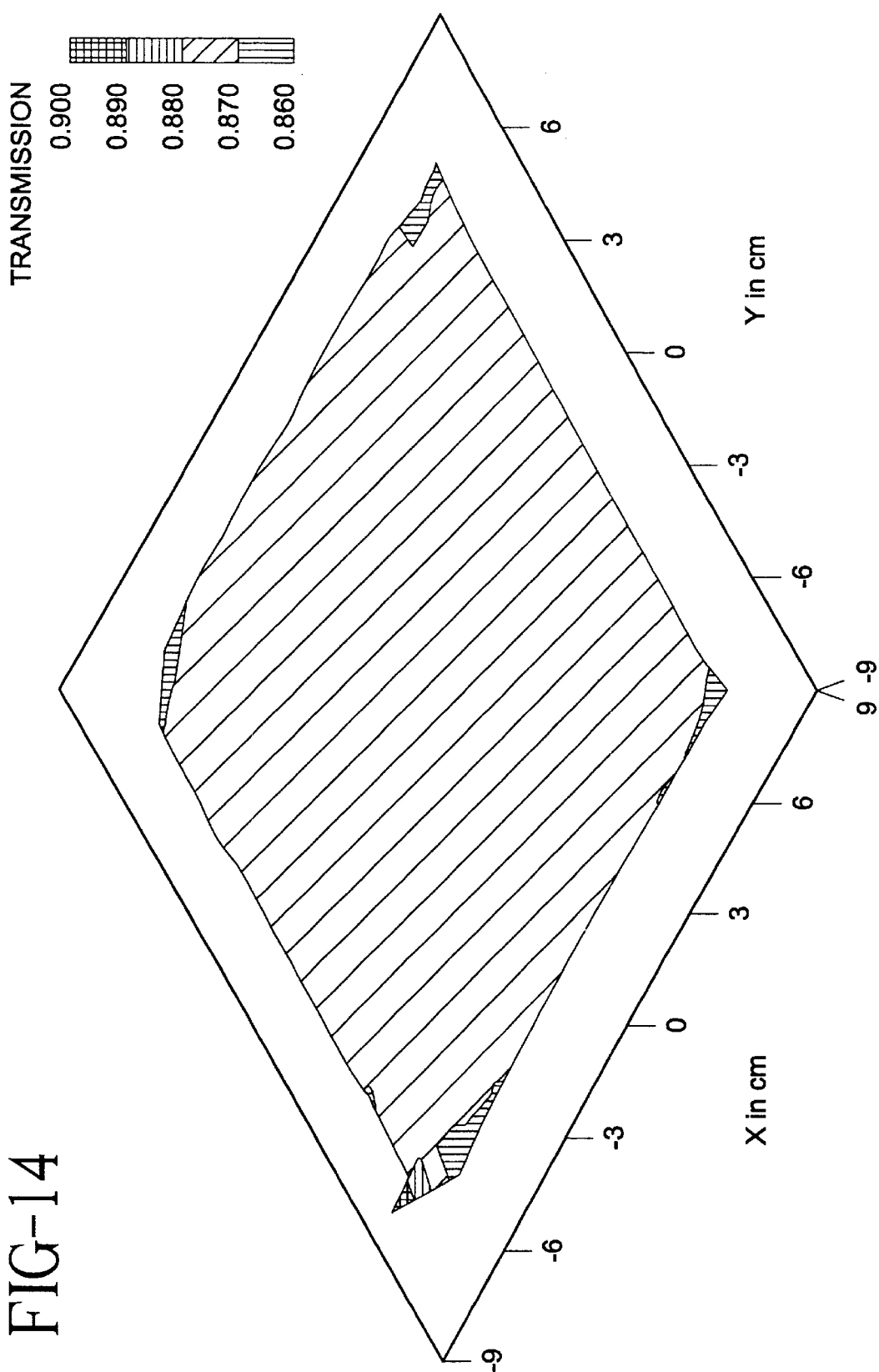
FIG. 14 is a plot of 193 nm transmission through the thickness of a mask blank across the face of the mask blank.

FIG. 14 shows the improvements achieved by the present invention. FIG. 14 is a 3-D contour map of percent transmission at 193 nm of a mask blank 20 of the invention. FIG. 14 illustrates the improved transmission uniformity of the invention. The transmission of 193 nm wavelength light through the thickness of mask 20 across the face of mask blank 20 is uniform with variation in transmission ≦1%.

Preferably mask blank 20 has a birefringence (measured at 632.8 nm) ≦5 nm/cm, more preferably ≦2 nm/cm; a chlorine concentration ≦1 ppm; an internal transmission Ti >99.5% per cm at 248 nm and Ti >99.0% per cm at 193 nm; a transmission uniformity which varies ≦1.5%, most preferably ≦1.0%.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

We claim:

1. A below three-hundred nanometer wavelength ultraviolet lithography light polarization mode dispersion inhibiting photolithography mask blank for producing lithography patterns while inhibiting polarization mode dispersion of transmitted ultraviolet lithography light, said polarization mode dispersion inhibiting mask blank comprised of a fused silica $SiO_2$ glass wafer having a longest dimension length L, a thickness T, a mask blank x-axis, a mask blank y-axis, a mask blank z-axis, said length L lying in a plane defined by said mask blank x-axis and said mask blank y-axis, said thickness T normal to said plane defined by said mask blank x-axis and said mask blank y-axis, said thickness T parallel with said mask blank z-axis, said mask blank having a first refractive index $n_x$ in the direction along said mask blank x-axis and a second refractive index $n_y$ in the direction along said mask blank y-axis wherein $|n_x-n_y|\leq 1$ ppm.

2. A mask blank as claimed in 1, said mask blank has a maximum 193 nm transmission $trans_{193xmax}$ and a minimum 193 nm transmission $trans_{193xmin}$ along said mask blank x-axis, a maximum 193 nm transmission $trans_{193ymax}$ and a minimum 193 nm transmission $trans_{193ymin}$ along said mask blank y-axis, wherein $(trans_{193xmax}-trans_{193xmin}) \leq 1\%$, $(trans_{193ymax}-trans_{193ymin}) \leq 1\%$.

3. A mask blank as claimed in 1 wherein $|trans_{193xmax}-trans_{193ymax}| \leq 1\%$, and $|trans_{193xmin}-trans_{193ymin}| \leq 1\%$.

4. A mask blank as claimed in 1 said mask blank has a maximum 248 nm transmission $trans_{248xmax}$ and a minimum 248 nm transmission $trans_{248xmin}$ along said mask blank x-axis, a maximum 248 nm transmission $trans_{248ymax}$ and a minimum 248 nm transmission $trans_{248ymin}$ along said mask blank y-axis, wherein $(trans_{248xmax}-trans_{248xmin}) \leq 1\%$, $(trans_{248ymax}-trans_{248ymin}) \leq 1\%$.

5. A mask blank as claimed in claim 4, wherein $|trans_{248xmax}-tran_{248ymax}| \leq 1\%$ and $|trans_{248xmin}-trans_{248ymin}| \leq 1\%$.

6. A mask blank as claimed in 1 wherein said mask blank is free of inclusions 15 having a dimension greater than one micron.

7. A mask blank as claimed in 1 wherein said fused silica $SiO_2$ glass consists essentially of Si and O.

8. A mask blank as claimed 1 in wherein said fused silica $SiO_2$ glass contains less than 1 ppm Cl.

9. A mask blank as claimed in 1 wherein said fused silica $SiO_2$ glass contains less than 1500 ppm OH.

10. A mask blank as claimed in 1 wherein said fused silica $SiO_2$ glass contains less than $3\times10^{17}$ molecules of $H_2/cm^3$.

11. A mask blank as claimed in 1 wherein said mask blank has a chemical durability weight loss $\leq 0.453$ mg/cm$^2$ from submersed exposure to a 95° C. temperature 5% NaOH solution by weight in water for a length of 6 hours.

12. A mask blank as claimed in 1 wherein said fused silica $SiO_2$ glass has an OH concentration which varies less than 200 ppm.

13. A mask blank as claimed in 1 wherein said fused silica $SiO_2$ glass has a variation in chlorine content which varies less than 1 ppm Cl.

14. A mask blank as claimed in 1 wherein said fused silica $SiO_2$ glass has a S concentration $\leqq 0.5$ ppm S.

* * * * *